United States Patent [19]

Walsh, Jr.

[11] Patent Number: 4,835,493

[45] Date of Patent: May 30, 1989

[54] VERY WIDE BANDWIDTH LINEAR AMPLITUDE MODULATION OF RF SIGNAL BY VECTOR SUMMATION

[75] Inventor: Kenneth A. Walsh, Jr., Santa Ana, Calif.

[73] Assignee: Hughes Aircraft Company, Los Angeles, Calif.

[21] Appl. No.: 110,150

[22] Filed: Oct. 19, 1987

[51] Int. Cl.$^4$ .............................................. H03C 1/50
[52] U.S. Cl. ........................................ 332/41; 332/48; 332/52
[58] Field of Search ................. 332/31 R, 31 T, 37 R, 332/37 D, 41, 48, 52, 1; 455/108

[56] References Cited

U.S. PATENT DOCUMENTS

| | | | |
|---|---|---|---|
| 2,614,246 | 10/1952 | Dome | 332/41 |
| 2,924,791 | 2/1960 | Starner | 332/41 |
| 3,906,401 | 9/1975 | Seidel | 455/108 X |
| 4,011,564 | 3/1977 | Gulick, Jr. | 343/16 M |
| 4,019,140 | 4/1977 | Swerdlow | 325/65 |
| 4,184,046 | 1/1980 | Parker | 179/1 GS |
| 4,218,586 | 8/1980 | Parker et al. | 179/1 GS |
| 4,251,688 | 2/1981 | Furner | 179/1 GQ |
| 4,373,115 | 2/1983 | Kahn | 179/1 GS |
| 4,404,431 | 9/1983 | Watanabe | 179/455 |
| 4,647,864 | 3/1987 | Rafferty et al. | 329/122 |
| 4,675,883 | 6/1987 | Thannhaeuser et al. | 375/83 |

*Primary Examiner*—Siegfried H. Grimm
*Attorney, Agent, or Firm*—Thomas A. Runk; Anthony W. Karambelas

[57] ABSTRACT

A radio frequency (RF) carrier wave is successively divided and the divided parts are non-linearly, phase modulated in response to a modulating signal. The modulating signal is linearized so that the output of the circuit is linear with the modulating signal and then drives differential drivers to control voltage controlled phase shifters in pairs to differentially phase shift the divided RF signals. These phase shifted signals may be efficiently amplified in non-linear, Class C, RF power amplifiers. After amplification the signals are differentially re-combined in an inverse binary tree of hybrid combiners to produce a synthesis output signal. This synthesis output signal is equivalent to the amplitude modulation, and the amplification, of the RF input signal. By operation of the circuit apparatus in accordance with the invention, amplitude modulation at wide bandwidths including hundreds of megahertz may typically be accomplished on microwave RF signals of high power levels including several kilowatts.

23 Claims, 2 Drawing Sheets

VERY WIDE BANDWIDTH LINEAR AMPLITUDE MODULATION OF RF SIGNAL BY VECTOR SUMMATION

BACKGROUND OF THE INVENTION

1. Field Of The Invention

The present invention generally concerns amplitude modulation of radio frequency (RF) signals, and, more particularly, concerns very wide bandwidth amplitude modulation of the output signal of a high power RF amplifier or transmitter.

2. Background Of The Invention

The present invention deals with the modulation, or systematic alteration of one waveform called the carrier wave, according to the characteristics of another waveform called the modulating signal or message. The goal of the invention is to produce an information-bearing modulated wave whose properties are suited to a given communication task. One such communication task addressed by the present invention is solid state radar signal transmission, especially for military applications. The present invention also addresses the task of modulation of high powered signals transmitted within Quadrature Amplitude Modulated (QAM) communication systems. Both of these applications are characterized by requiring very wide bandwidth, ranging to hundreds of megahertz, amplitude modulation (AM) of microwave radio frequency (RF) signals exhibiting high power levels ranging to kilowatts and greater.

Amplitude modulation (AM) is well known in the art as a means of transmitting information upon a carrier signal wherein the amplitude of the carrier signal is modulated in response to the information signal. Amplitude modulation is commonly used for a number of applications including commercial radio transmissions. Amplitude modulators also have application in military systems in connection with high power and wide bandwidth systems, such as are utilized in radar systems or quadrature amplitude modulated (QAM) communications systems.

The present invention is specifically directed to performing linear, amplitude, modulation. As described below, the present invention effects linear AM exclusively by exponential, angle, non-linear modulation. Most particularly, the present invention affects AM by use of phase modulation (PM) which, along with frequency modulation (FM) is the major practical type of exponential, angle modulation.

Major differences between linear and exponential modulation in the spectrum of the modulated signal, in the bandwidth of the modulated signal, and in the signal-to-noise ratio of the modulated signal are well known. Those differences are often discussed in the context of the transmission of linearly versus exponentially modulated signals.

Contemporary transmission systems are typically unable to effectively perform amplitude modulation for high power RF signals (e.g. in the kilowatt range) having wide bandwidths (e.g. hundreds of MHz). Such contemporary systems typically generate an amplitude modulated RF signal at a low power level, nominally milliwatts, in a balanced mixer. A linear amplifier is then used to boost the amplitude modulated RF signal to high power levels. High power linear, Class A, amplifiers used in contemporary systems are relatively inefficient and expensive. Non-linear RF power amplifiers—particularly the Class C types—are much more efficient and inexpensive than their counterpart Class A types. Moreover, in practical forms, Class C amplifiers are generally capable of much higher output power levels. Class C type amplifiers cannot be substituted in contemporary transmission systems of the type discussed because they introduce unacceptable distortion into the amplified output signal. That distortion renders the information contained in the return signal substantially less discernible and therefore reduces the effectiveness of the system.

The present invention is directed to the production of a signal which is the exact equivalent of a linearly, amplitude modulated signal. In accordance with the present invention exponential modulation is used in an exponentially modulated signal to obtain a linearly, amplitude modulated signal permits the invention to advantageously utilize the capabilities, and efficiencies, of solid state (i) modulators and (ii) amplifiers of high power RF signals. Consequently, the present invention is concerned with the use of non-linear, nominally Class C, power amplifiers, i.e. in lieu of one or more linear amplifiers, to obtain a linearly, amplitude, modulated RF signal. Furthermore, as well as enabling the efficient and cost effective use of the preferred non-linear amplifiers, the present invention greatly extends (i) the bandwidth of modulation which may be effectively applied to RF signals and (ii) the power efficiency of the resulting amplitude modulated signal. Therefore, among other advantages, the present invention uses amplifiers preferred for their cost and efficiency, produces relatively fast rise times, allows realization of very wide bandwidth AM of RF signals, and allows this realization to be on RF signals which are of very high power.

SUMMARY OF THE INVENTION

The present invention is embodied in a method, and an apparatus, for wide bandwidth, linear, amplitude modulation (AM) of a radio frequency (RF) signal. The method and apparatus in accordance with the present invention accomplishes AM of the RF signal by vector summation of a number of RF signal portions which are individually non-linearly, exponentially, phase modulated. Realization of AM of an RF signal by vector summation of PM portions of such RF signal is, in accordance with the present invention, an approach offering considerable advantages.

Phase modulation of the RF signal is readily performable using voltage controlled phase shifters. Phase modulated RF signal portions are conveniently amplified by non-linear, exponential, nominally Class C, power amplifiers, which are both relatively efficient and inexpensive. Phase modulation eliminates the requirement for the average transistor collector current to follow the modulation envelope, as would be the case where the input carrier wave is amplitude modulated or where modulation is applied through the DC collector voltage. When amplified, phase-modulated RF signal portions are differentially combined by vector summation. The synthesized output signal may be of a high power level.

Still other advantages such as modularity and failure isolation are inherent in the present invention. By the method and apparatus of the present invention AM at rates including hundreds of MHz may be accomplished on RF signals of high power levels, e.g., greater than one kilowatt.

In accordance with the preferred embodiment of the present invention, an RF input, or carrier, signal is divided by signal dividers into RF signal portions called divided RF signals. The divided RF signals are each controllably phase shifted by phase shifters. The phase shifters are controlled for phase shifting by the modulation signal, particularly by a predistortion of the modulation signal that compensates for non-linearity of vector summation. This linearized modulation signal drives differential driver amplifiers to differentially control the phase shifters in pairs in order to produce differentially phase shifted, divided RF signals. The dividers and phase shifters are preferably organized in a binary tree of n ranks producing $2^n$ differentially phase shifted, divided RF signals at the final, leaf node, rank.

The $2^n$ differentially phase shifted, divided RF signals are vector summed by being differentially combined in hybrid combiners in order to produce a synthesized output signal. The hybrid combiners are preferably organized as an inverse binary tree of n ranks. The synthesized output signal is equivalent to the AM of the RF input signal. Importantly to the benefical application of the present invention, the $2^n$ differentially phase shifted, divided RF signals are each capable of being amplified by an efficient, non-linear, RF power amplifier which is nominally of Class C. Nominally $2^n$ amplifiers are positioned between the binary tree of dividers and phase shifters and the inverse binary tree of combiners. When the $2^n$ amplified signals are differentially re-combined in the differential combiners then the synthesized signal output—equivalent to the AM of the RF input signal—is of high power. The RF input, or carrier signal is thus effectively linearly amplitude modulated by the vector summation of non-linearly, exponentially, phase-modulated divided portions of such input RF signal. Linear modulation is, therefore, accomplished by a combination of non-linear modulations. Particularly, AM is accomplished by angle modulation, particularly by PM.

BRIEF DESCRIPTION OF THE DRAWINGS

FIG. 1b is a schematic block diagram illustrating an optional switching feature that may be incorporated into the circuitry set forth at FIG. 1a.

DESCRIPTION OF THE PREFERRED EMBODIMENT

The detailed description set forth below in connection with the appended drawings is intended merely as a description of the presently preferred embodiments of the invention, and is not intended to represent the only form in which the present invention may be constructed or utilized. The description sets forth the functions and sequence of steps for construction and implementation of the invention in connection with the illustrated embodiments. It is to be understood, however, that the same or equivalent functions and sequences may be accomplished by different embodiments that are also intended to be encompassed within the spirit and scope of the invention.

Figure 1A:
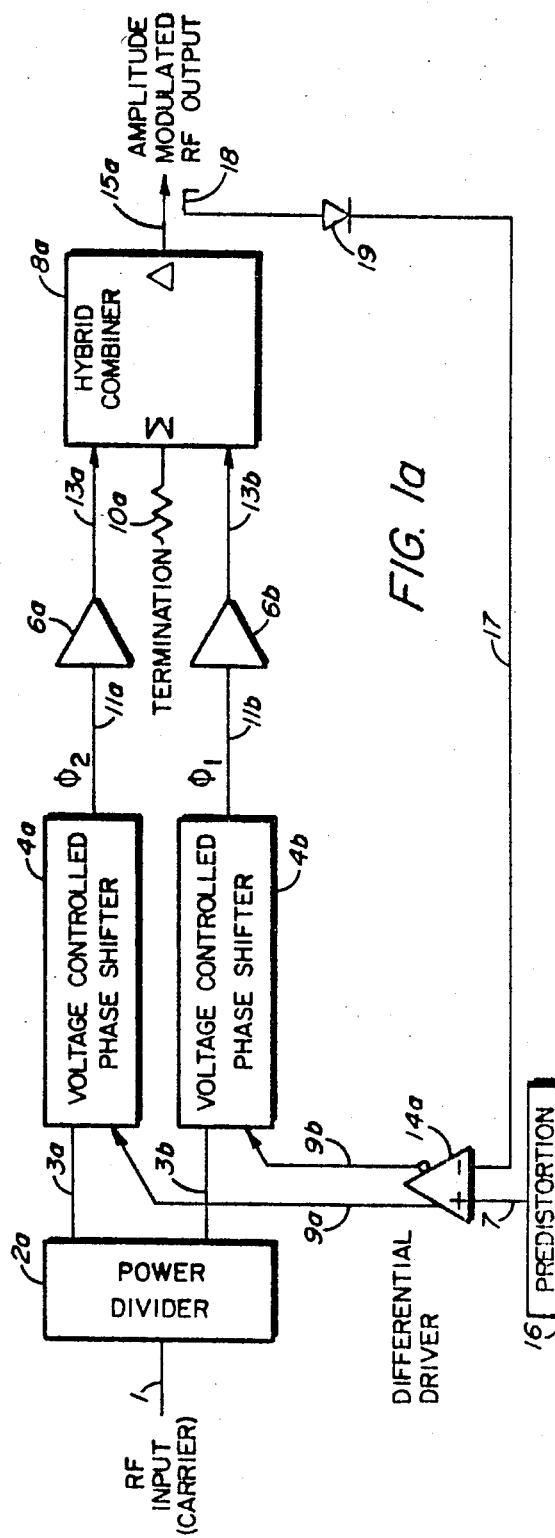
FIG. 1a is a simplified schematic block diagram illustrating the basic principles of the present invention.

A schematic block diagram of a basic apparatus for performing wide bandwidth amplitude modulation (AM) of a radio frequency (RF) signal in accordance with the present invention is shown in FIG. 1a. An RF (CARRIER) signal is received by POWER DIVIDER 2a line 1 and divided into two signals output at 3a,b. The divided RF signals 3a,b are received by respective VOLTAGE CONTROLLED PHASE SHIFTERS 4a,b. Each of the VOLTAGE CONTROLLED PHASE SHIFTERS 4a,b is a high speed varactor diode controllable to variably phase shift the divided RF signal. The VOLTAGE CONTROLLED PHASE SHIFTERS 4a,b are controlled for phase shifting the divided RF signals by respective control signals derived from MODULATION INPUT signal 5.

A predistortion linearizer 16 is used to modify the modulation input on line 5 such that the amplitude modulated RF output on line 15a is linear in relation to the modulation input. In one case, the predistortion linearizer 16 would be used alone with no feedback from line 15a. In a second case, the feedback loop 17 and differential driver 14a would be used to establish linearity. In this second case, the predistortion linearizer 16 would not be used. In a third case, the predistortion linearizer 16 may be used to establish the gross linearization and the differential driver 14a with the feedback loop 17 used for fine linearization.

In most cases, linearization of some type is required because of the $\sin^2$ combining which would occur in combiner 8a as discussed further below. This becomes more important as multiple tiers are added because non-linearities can multiply. This linearizing modulation signal is differentially amplified by DIFFERENTIAL DRIVER 14a to produce two equal magnitude, and opposite polarity, control signals 9a,b. Those differential control signals are respectively applied to VOLTAGE CONTROLLED PHASE SHIFTERS 4a,b to control the phase shifters differentially, i.e. to phase shift the divided RF signal equally in opposite phase directions. Consequently, the signals output from the pair of VOLTAGE CONTROLLED PHASE SHIFTERS 4a,b will be differentially phase shifted, divided RF signals, output at lines 11a,b. Those signals are labeled $\phi_2$ and $\phi_1$ and are each a phase shifted version of the RF INPUT (CARRIER) signal input at line 1. To obtain minimum output amplitude, the VOLTAGE CONTROLLED PHASE SHIFTERS 4a,b are controlled to have equal insertion phase so that a null appears at the difference port 15a of HYBRID COMBINER 8a. Thus, if no modulation input is present, there will be no output on line 15a.

The differentially phase shifted, divided RF signals 11a,b are optionally respectively amplified in amplifiers 6a,b. Amplifiers 6a,b are not essential to the operation of the current schematic block diagram in FIG. 1a, which will successfully perform linear amplitude modulation without amplifiers 6a,b. However, the amplifiers 6a,b are normally included both to overcome energy losses occurring in HYBRID COMBINER 8a, and to enable production of a synthesized, AMPLITUDE MODULATED RF OUTPUT signal 15a of high power. Each of the amplifiers 6a,b is not required to follow the amplitude envelope of the MODULATION INPUT SIGNAL 5. Rather each of the amplifiers 6a,b need amplify only a differentially phase shifted, divided RF signal portion of the RF INPUT (CARRIER) signal 1. Consequently, the amplifiers 6a,b are preferably non-linear amplifiers, preferably of Class C. These non-linear, Class C amplifiers are both relatively efficient and relatively inexpensive. Dependent upon the power desired in the AMPLITUDE MODULATED RF OUTPUT signal 15a, the non-linear amplifiers 6a,b may typically each have a power output in the ten to thousands of watts range, where linear amplifiers cannot efficiently operate.

Figure 1B:
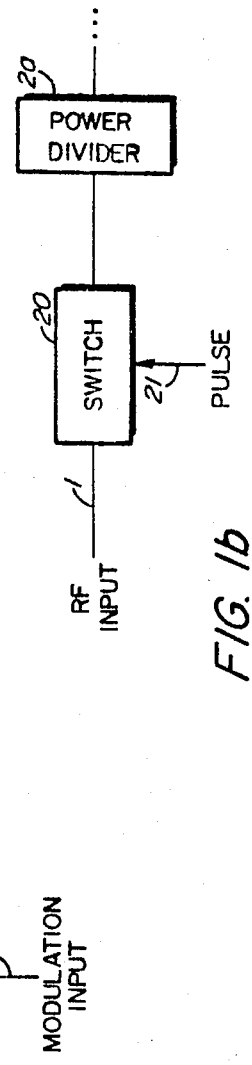

The optionally amplified, differentially phase shifted, divided RF signals are output from PHASE SHIFTERS 4a, 4b and communicated to HYBRID COMBINER 8a along lines 13a, b. The HYBRID COMBINER 8a functions to differentially combine these received signals to produce both the sum and the difference of these signals. The signal produced at the sum, ($\Sigma$), port of HYBRID COMBINER 8a is proportional to $\cos^2 ((\phi_2 - \phi_1)/2)$. This summation signal power is dissipated in a load, or terminating, resistor, 10a. Such power loss may be minimized by using another arrangement such as that shown in FIG. 1b. In that Figure, a switch 20, such as a PIN diode, is used to apply the RF INPUT (CARRIER) to the circuit. In some applications, this switch 20 would change state to "on" at a predetermined time prior to receipt of the modulation input to permit settling of the collector currents in the amplifiers 6a, 6b. That change of state is shown to be responsive to the control signal PULSE 21. It will also be recognized that other means may be implemented to overcome signal power loss without departing from the broader aspects of the present invention.

The difference signal produced at the difference, ($\Delta$) port of HYBRID COMBINER 8a will have a power proportional to $\sin^2 ((\phi_2 - \phi_1)/2)$. The synthesis difference signal output at line 15a is the vector summation of the amplified differentially phase shifted, divided RF signals on lines 13a,b. It is actually the amplitude modulation of the RF INPUT (CARRIER) signal. It is consequently called the AMPLITUDE MODULATED RF OUTPUT signal and appears at line 15a. As discussed above, an optional feedback loop may be provided from the output of HYBRID COMBINER 8a to the DIFFERENTIAL AMPLIFIER 14a. The optional loop 17, including detector 18 and diode 19, would provide negative feedback to limit distortion of the AMPLITUDE MODULATED RF OUTPUT in relation to the MODULATION INPUT SIGNAL. The feedback loop 17 may serve the same function as does LINEARIZER 16, particularly at lower modulation frequencies.

Figure 2:
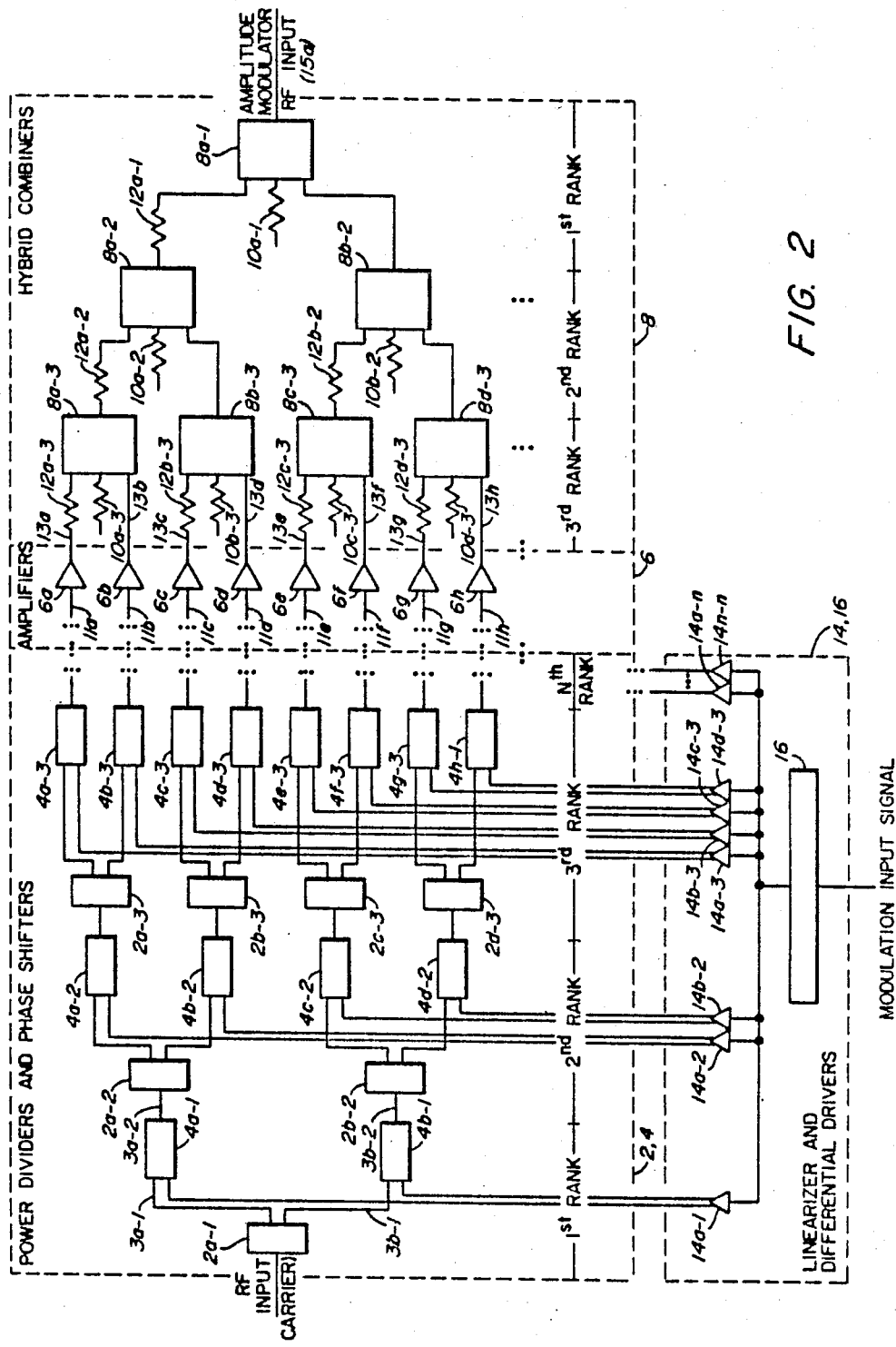
FIG. 2 is a schematic block diagram illustrating a preferred embodiment of a multiple-tiered electrical circuit structure in accordance with the present invention.

A second embodiment in accordance with the present invention is shown in schematic block diagram form at FIG. 2. Components shown at FIG. 2 may be recognized by their association with like-numbered components at FIG. 1. The POWER DIVIDERS AND PHASE SHIFTERS 2,4 are organized as a binary tree. Within each rank of the binary tree, a POWER DIVIDER 2 divides a received RF signal (which may be in parallel subsequent to the first PHASE SHIFTER) and divides such signal into two divided RF signals. These divided RF signals are received by an associated pair of VOLTAGE CONTROLLED PHASE SHIFTERS 4 within the same rank, and are phase shifted in accordance with differential control signals received from LINEARIZER AND DIFFERENTIAL DRIVERS 14,16. For example, the root node, first rank POWER DIVIDER 2a-1 receives the RF INPUT (CARRIER) signal and divides that signal into divided RF signals 3a-1, 3b-1. These divided-rf signals 3a-1, 3b-1 are received by a respective associated one of VOLTAGE CONTROLLED PHASE SHIFTERS 4a-1, 4b-1, which associated ones are still within the root node or first rank. The phase shifted, divided RF signals 3a-2, 3b-2 produced at the first rank are next received at POWER DIVIDERS 2a-2, 2b-2 of the second rank. The division of these signals are in turn supplied to the VOLTAGE CONTROLLED PHASE SHIFTERS 4a-2 through 4d-2 of the second rank. The process continues for any desired number of ranks.

The number of ranks reflects both the practical dynamic range, and the level of distortion at a given bandwidth, which will be realized by the apparatus and method in accordance with the present invention. Generally it is recommended that approximately one rank per 20 dB of dynamic range should be used. The use of vector summation simultaneously on several ranks of corporately combined power amplifiers provides high dynamic range with ordinary component tolerances. For example, if five tiers are used and each provides 15 dB dynamic range, a total of 75 dB dynamic range will be obtained. Contemporary techniques for obtaining a 75 dB dynamic range from a single rank would impose impossibly tight phase and amplitude balance requirements.

Within the binary tree of POWER DIVIDERS AND PHASE SHIFTERS, 2,4 each pair of the VOLTAGE CONTROLLED PHASE SHIFTER 4 at each rank is controlled by an associated one of the DIFFERENTIAL DRIVERS 14 which is of the same rank. The number of DIFFERENTIAL DRIVERS 14 is thus equal to one half the numbers of the VOLTAGE CONTROLLED PHASE SHIFTER 4. It should be noted that a single DIFFERENTIAL DRIVER 14 may be used to drive all of the PHASE SHIFTERS 4. Moreover, all the DIFFERENTIAL DRIVERS 14 may be driven in parallel by a single LINEARIZER 16.

The result of the successive dividing and differential phase shifting is that at a final, nth, rank some $2^n$ leaf node VOLTAGE CONTROLLED PHASE SHIFTERS 4 will produce $2^n$ phase shifted, divided RF signals on lines 11a–n, of which the signals 11a–h are shown in FIG. 2. These $2^n$ differentially phase shifted, divided RF signals are individually received, and amplified, at a respective one of amplifiers 6a–n, of which the amplifiers 6a–h are shown in FIG. 2.

As with the embodiment of the present invention shown in FIG. 1a, the inclusion of AMPLIFIERS 6 within the preferred embodiment shown in FIG. 2 is optional. Save for the inclusion of these AMPLIFIERS 6 all power to drive the circuit is derived from the RF INPUT (CARRIER) signal 1. The amplification of the RF INPUT (CARRIER) signal is typically preferable to achieve high output power levels.

The amplifiers 6a–h each amplify a divided differentially phase shifted RF signal portion which does not vary in amplitude. The signal portion received at the amplifier will vary in phase only with the slew rate of the differential phase shifting, which slew rate is proportional to the slew rate of amplitude change in the modulation signal. Generally this slew rate results in an effective phase variation at the input to each of amplifiers 6a–h. Each of the amplifiers 6a–h essentially amplifies a constant amplitude, constant frequency portion of the carrier wave. The amplifiers 6a–h are, of course, insensitive to the fact that such signal portion may have been phase shifted or delayed in time relative to other signal portions. The amplifiers 6a–h are thus preferably of the Class C type and are tuned to efficiently amplify these constant amplitude, constant frequency signal portions at high gain to high power levels. The distortion problem occuring with an attempted use of a non-linear Class C amplifier to amplify amplitude modulated (i.e. varying amplitude) signals does not affect the use of such amplifiers within the circuit apparatus of the present invention. Also, by not having a changing amplitude, the non-linear Class C amps will have relatively fast rise times, e.g. a few nanoseconds, because the collector current need not follow the modulation envelope.

As shown at FIG. 2, the HYBRID COMBINERS 8 may be structured as a reverse binary tree. In such configuration, the combined HYBRID COMBINERS 8 are often referred to as corporate combiners that operate on the amplified, differentially phase shifted, divided RF signals $13a-n$ in corporate, or associated, form. In this corporate form, the $2^{n-1}$ leaf node HYBRID COMBINERS 8 receive by pairs the $2^n$ signals $13a-n$. Within FIG. 2 signals $13a-h$ and third rank HYBRID COMBINERS $8a-3$ through $8d-3$ are illustrated. Each rank of HYBRID COMBINERS serves to combine by pairs the received signals until the AMPLITUDE MODULATED RF OUTPUT signal $15a$ is produced. In one application, the dynamic range of each rank of HYBRID COMBINERS should be limited to approximately 20 dB maximum so that a coherent and sufficiently strong signal remains for the next rank to act upon. It has been found that above this limit, practical circuit tolerances, including phase and amplitude tracking capabilities, result in a degraded performance. Practical limits, such as leakage in hybrid combiners, non-linearities in phase shifters, and other characteristics, contribute to establishing this 20 dB range.

In accordance with the preceding discussion, certain variations and modifications of the method and apparatus in accordance with the present invention will be perceived to be possible without departing from the true scope and spirit of the invention. For example, the POWER DIVIDERS 2 need not appear as separate circuit elements. The function of DIVIDERS 2 can alternately be performed by equalized input impedances at each pair of the VOLTAGE CONTROLLED PHASE SHIFTER 4. Similarly, it will be understood by one of ordinary skill in the art of radar circuit design that AMPLIFIERS 6 could be of diverse types, and depending upon the application, may include a Class A linear type. Additionally, power losses at the sum port of the HYBRID COMBINERS 8 may be minimized for pulse modulation by switching off the RF INPUT (CARRIER) signal during most of the inter-pulse period.

These and other possible variations of the present invention should be recognized to be broadly directed to realizing linear amplitude modulation of an RF signal by means which are distinctly non-linear, and are of the exponential, angle (and particularly phase) modulation type. Accordingly, the scope of the present invention is not intended to be limited to the preferred embodiment within which the present invention has been illustrated.

What is claimed is:

1. An apparatus for linearly amplitude modulating an RF carrier wave signal in accordance with a modulating signal, comprising:
   a plurality of dividers for dividing the carrier wave into a plurality of divided signals;
   a plurality of non-linear phase modulators, each responsive to a respective amplitude portion of the modulating signal for modulating one of said divided signals to produce a corresponding plurality of modulated carrier wave signals;
   a plurality of combiners for differentially combining the plurality of modulated carrier wave signals into a composite output signal;
   wherein the composite output signal is a linear amplitude modulation of the carrier wave in response to the amplitude of the modulating signal.

2. The apparatus as recited in claim 1 wherein the modulators comprise:
   a plurality of phase shifters operative to controllably phase shift the divided RF signals by an amount proportional to the amplitude of the modulating signal.

3. The apparatus as recited in claim 2 further comprising:
   a plurality a differential drivers for differentially controlling the phase shifters in response to the amplitude of the modulation signal to produce differentially phase shifted, divided RF signals.

4. The apparatus as recited in claim 3 wherein each of the plurality of differential drivers produces, in response to an amplitude portion of the modulating signal, two differential control signals which control a respective two of the plurality of phase shifters to each produce two differentially phase shifted, divided RF signals.

5. The apparatus as recited in claim 1 wherein each of the plurality of differential combiners receives two signals and produces therefrom a single signal as the differential combination of the two signals.

6. The apparatus as recited in claim 3 wherein the plurality of dividers and the plurality of phase shifters are jointly connected as a binary tree for linearly modulating the carrier signal by means of multiple stages each stage modulating a part of said carrier signal;
   wherein a first one of the plurality of dividers receives the radio frequency signal and provides divided RF signals to two of the plurality of phase shifters;
   wherein the two of the plurality of phase shifters in turn provide the phase shifted divided signals to a next rank two of the plurality of dividers;
   wherein this next rank two of the plurality of dividers provides divided RF signals to this next rank's four of the plurality of phase shifters;
   wherein the plurality of dividers and the plurality of phase shifters continue interleaved and connected in a binary tree until at a final rank, $2^n$ phase shifters produce $2^n$ phase shifted divided RF signals; and
   wherein the plurality of combiners are connected as a binary tree of n ranks, receiving by pairs the $2^n$ phase shifted signals and combining the $2^n$ phase shifted signals into $2^{(n-1)}$ combined signals received by a next rank of combiners and continuing connected as a binary tree until a final combiner produces the composite output signal.

7. The apparatus according to claim 6:
   wherein the plurality of dividers numbers $2^0 + 2^1 + 2^2 + \ldots + 2^{(n-)}$;
   wherein the plurality of phase shifters numbers $2^1 + 2^2 + \ldots + 2^n$;
   wherein the plurality of differential drivers numbers $2^0 + 2^1 + \ldots + 2^{(n-1)}$; and
   wherein the plurality of differential combiners numbers $2^n + 2^{(n-1)} + \ldots 2^0$.

8. The apparatus according to claim 2 further comprising:
   a plurality of amplifiers receiving the phase shifted divided RF signals produced by the plurality of phase shifters and amplifying the phase shifted divided RF signals prior to the receipt thereof by the plurality of combiners.

9. The apparatus according to claim 3 wherein at least one of the plurality of differential drivers comprises:
a predistortion linearizer for linearizing a portion of the modulation signal to produce a linearized modulation signal; and
a differential amplifier for receiving the linearized modulation signal and producing two differential control signals responsively thereto.

10. The apparatus according to claim 2 wherein at least one of the combiners includes a difference port and a summation port and the power of the differentially combined phase shifted divided RF signal at the difference port of the hybrid combiner is proportional to $$\sin^2\left(\frac{\phi_2 - \phi_1}{2}\right)$$

wherein $\phi_1$ and $\phi_2$ are two phase shifted divided RF signals which are differentially combined.

11. The apparatus according to claim 1 further comprising a feedback loop for communicating a signal responsive to the composite output signal to the non-linear phase modulators for regulating the operation of the phase modulators so that the modulation of the composite output signal is responsive to the modulating signal.

12. The apparatus according to claim 8 wherein at least one of the amplifiers comprises:
a non-linear Class C amplifier.

13. An apparatus for applying a modulating signal to a carrier wave to effect linear amplitude modulation of the carrier wave, comprising:
divider means for dividing, using a binary tree division of n ranks where n is an integer greater than one, the carrier wave into a plurality of $2^n$ divided signals;
modulator means for applying, at each rank of said binary tree division, non-linear phase modulation to each of the divided signals in response to respective amplitude portions of the modulating signal to produce a corresponding plurality of $2^n$ phase modulated divided signals; and
combiner means for differentially combining, using a binary tree combination of n ranks, the $2^n$ non-linear phase modulated signals into a single composite output signal which is a linear amplitude modulation of the carrier wave.

14. A method of linearly amplitude modulating an RF carrier wave signal by a modulating signal comprising:
dividing, using a binary tree division of n ranks where n is an integer greater than one, the carrier wave signal into $2^n$ portions;
non-linearly phase modulating the carrier wave signal portions at each rank of said binary tree division in response to an amplitude of the modulating signal to produce $2^n$ non-linearly modulated carrier wave signal portions; and
combining the $2^n$ modulated carrier wave signal portions using a binary combination of n ranks to produce a single composite signal;
wherein the composite signal is a linear amplitude modulation of the carrier wave signal by the modulating signal.

15. The method as recited in claim 14 wherein the step of modulating comprises:
phase angle modulating the RF signal portions in order to produce differentially phase angle modulated carrier wave signal portions.

16. The method as recited in claim 15 wherein the step of combining comprises:
differentially combining the phase angle modulated carrier wave signal portions.

17. The method as recited in claim 15 wherein the phase angle modulating comprises:
differentially phase shifting the RF signal portions in response to a modulation signal.

18. A method of linearly amplitude modulating an RF carrier wave signal by a modulating signal comprising:
dividing and non-linearly differentially phase shifting by portions in a hierarchal tree in response to an amplitude of the modulating signal until the RF signal has been successively divided and phase shifted into $2^n$ phase-shifted signals, where n is an integer greater than one;
differentially combining the $2^n$ phase-shifted signals to produce a composite signal; and
wherein the composite signal is a linear amplitude modulation of the carrier wave signal by the modulating signal.

19. The method as recited in claim 17 further comprising:
amplifying the phase-shifted signals.

20. The method according to claim 19 wherein the differential phase shifting comprises:
differentially amplifying the modulating signal into modulation signal halves of equal magnitude and opposite polarity; and
independently phase shifting each of the RF signal portions in response to a separate one of the modulation signal halves;
wherein the opposite polarity of the modulation signal halves makes that the RF signal portions are differentially phase shifted.

21. The method as recited in claim 20
wherein the independently phase shifting is in voltage controlled phase shifters;
wherein the differentially amplifying is in amplifiers; and
wherein the differentially combining is in hybrid combiners.

22. The method as recited in claim 19 wherein the amplifying comprises:
non-linearly amplifying the phase shifted signals.

23. The method as recited in claim 22 wherein the amplifying further comprises:
amplifying the phase shifted signals using Class C amplifiers.

* * * * *